to the current mirror circuit.

(12) United States Patent
Ding

(10) Patent No.: US 10,651,796 B2
(45) Date of Patent: May 12, 2020

(54) RESISTORLESS POWER AMPLIFIER

(71) Applicant: Advanced Semiconductor Engineering, Inc., Kaohsiung (TW)

(72) Inventor: Jaw-Ming Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 87 days.

(21) Appl. No.: 15/887,635

(22) Filed: Feb. 2, 2018

(65) Prior Publication Data

US 2019/0245488 A1  Aug. 8, 2019

(51) Int. Cl.
*H03F 1/02* (2006.01)
*H03F 3/19* (2006.01)
*H03F 3/21* (2006.01)
*H04B 1/04* (2006.01)

(52) U.S. Cl.
CPC ............. *H03F 1/0205* (2013.01); *H03F 3/19* (2013.01); *H03F 3/21* (2013.01); *H03F 2200/451* (2013.01); *H04B 1/04* (2013.01)

(58) Field of Classification Search
CPC .................................................. H03F 1/0205
See application file for complete search history.

(56) References Cited

U.S. PATENT DOCUMENTS

| | | | | |
|---|---|---|---|---|
| 2010/0019852 A1* | 1/2010 | Leitner | ................... | H03F 1/302 330/296 |
| 2010/0127776 A1* | 5/2010 | Chow | ..................... | H03F 1/223 330/277 |
| 2011/0163809 A1* | 7/2011 | Tsurumi | ................ | H03F 3/3045 330/257 |
| 2014/0043102 A1* | 2/2014 | Su | ........................... | H03F 3/193 330/295 |
| 2015/0054583 A1* | 2/2015 | Miyashita | ................ | H03G 3/00 330/285 |
| 2016/0065135 A1* | 3/2016 | Yotsuji | .................. | H03F 1/0261 |

* cited by examiner

*Primary Examiner* — Patricia T Nguyen
(74) *Attorney, Agent, or Firm* — Foley & Lardner LLP

(57) ABSTRACT

The present disclosure relates to a power amplifier circuit including a current source, a power control circuit, a current mirror and an output circuit. The current source circuit includes a first transistor and a second transistor. A source of the first transistor is connected to a drain of the second transistor and a gate of the first transistor is connected to a source with the second transistor. The power control circuit is connected to a gate of the second transistor. The current mirror circuit is connected to the gate of the first transistor and a source of the second transistor. The output circuit is connected to the current mirror circuit.

20 Claims, 6 Drawing Sheets

RESISTORLESS POWER AMPLIFIER

BACKGROUND

1. Technical Field

The present disclosure relates to a power amplifier, and more particularly, to a bias circuit for a power amplifier.

2. Description of the Related Art

A power amplifier is a circuit in a wireless transceiver for amplifying a signal to be transmitted. The power amplifier can be powered by a power source circuit, such as a current source (or a current sink) connected with a current mirror. When the power amplifier is used for mobile devices (such as a cell phone, a tablet or a notebook), it may be desirable to have the power consumption of the power amplifier and the power source circuit be relatively low. In order to precisely control or reduce the current applied to the power amplifier, relative large resistors (e.g. in a range of kilo-ohms (k ohms) to mega-ohms (M ohm)) can be used. However, the large resistors may increase a chip/die area, which can hinder miniaturization of the chip/die.

SUMMARY

In accordance with an aspect of the present disclosure, a power amplifier circuit includes a current source, a power control circuit, a current mirror and an output circuit. The current source circuit includes a first transistor and a second transistor. A source of the first transistor is connected to a drain of the second transistor and a gate of the first transistor is connected to a source with the second transistor. The power control circuit is connected to a gate of the second transistor. The current mirror circuit is connected to the gate of the first transistor and a source of the second transistor. The output circuit is connected to the current mirror circuit.

In accordance another aspect of the present disclosure, a power amplifier circuit includes a current source circuit, a current mirror, a power control circuit and an output circuit. The power control circuit includes a first transistor and a second transistor. The first transistor has a drain connected to a first voltage input, a gate connected to a ground and a source connected to a gate of the second transistor. The current mirror circuit has a first node connected to the current source circuit and a second node connected to a source of the second transistor. The output circuit is connected to the current mirror circuit.

In accordance another aspect of the present disclosure, a power amplifier circuit includes a current source circuit, a current mirror circuit, a power control circuit and an output circuit. The current source circuit is configured to generate a first current. The current mirror circuit is connected to the current source and configured to generate a second current in response to the first current. The power control circuit is connected to the current source circuit and the current mirror circuit and configured to receive a first voltage. The output circuit is connected to the current mirror circuit and configured to generate a third current. The third current varies in response to the first voltage.

In accordance another aspect of the present disclosure, a wireless communication system includes a GaAs power amplifier and a GaN transistor. The GaAs power amplifier has an input configured to receive a first signal and an output configured to output an amplified signal. The GaN transistor has a source connected to the output of the power amplifier, and a gate connected to a ground.

Figure 1A:
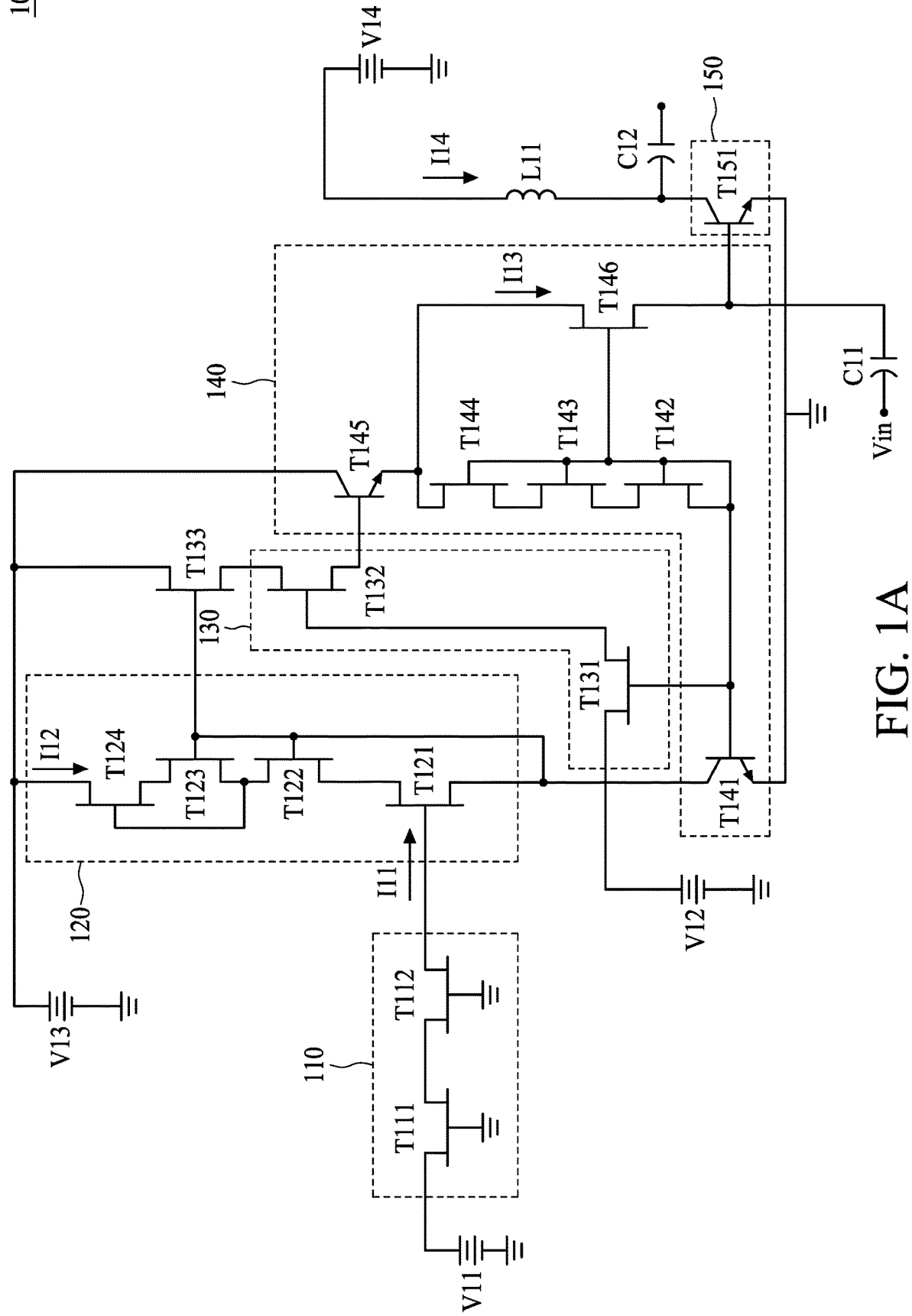
FIG. 1A is a schematic diagram illustrating a power amplifier in accordance with some embodiments of the present disclosure.

Common reference numerals are used throughout the drawings and the detailed description to indicate the same or similar components. The present disclosure can be readily understood from the following detailed description taken in conjunction with the accompanying drawings.

DETAILED DESCRIPTION

Although described with particular reference to a portable transceiver, the circuit and method for biasing a gallium arsenide (GaAs) power amplifier (also referred to as the GaAs bias circuit) can be implemented in any GaAs device in which it is desirable to provide a bias current and voltage. Furthermore, the circuitry described below can be fabricated using an integrated bipolar-field effect transistor (BIFET) process utilizing a lower turn-on voltage of field effect transistors. Furthermore, in particular embodiments, the transistors described below include bipolar junction transistors (referred to as a BJT), which includes heterojunction bipolar junction transistors (referred to as an HBT) and field effect transistors (referred to as a FET) or pseudomorphic high-electron mobility transistors (referred to as a pHEMT) that are fabricated using what is referred to as the BIFET or BiHEMT process.

As used herein, reference to a gate, source, drain, or other component of a transistor or other circuit component being connected to a gate, source, drain, or other component of another transistor or other circuit component can refer to a direct connection, or to a connection with another circuit component (e.g. a transistor) disposed therebetween.

FIG. 1A is a schematic diagram illustrating a power amplifier 100 in accordance with some embodiments of the present disclosure. The power amplifier 100 includes a power control circuit 110, a current source circuit 120, an enable circuit 130, a current mirror circuit 140 and an output circuit 150. The power amplifier 100 further includes a transistor T133, a capacitor C11, a capacitor C12, and an inductor L11.

The power control circuit 110 includes transistors T111 and T112. A drain of the transistor T111 is connected to an input voltage V11, a gate of the transistor T111 is connected to a ground (that is, to a ground voltage) and a source of the transistor T111 is connected to a drain of the transistor T112. A gate of the transistor T112 is connected to a ground and a source of the transistor T112 is connected to the current source circuit 120. In some embodiments, the number of the transistors of the power control circuit 110 can be adjusted depending on design specifications. For example, the power control circuit 110 may include one transistor or more than two transistors connected in series. For example, in one or more embodiments, the transistor T111 may be omitted.

In some embodiments, the transistors T111 and T112 are depletion mode (D-mode) pseudomorphic high electron mobility transistors (pHEMT), and thus the transistors T111 and T112 can limit the voltage of an input of the current source circuit (e.g., a gate of the transistor T121) to a predetermined voltage. For example, if a pinch-off voltage of each of the transistors T111 and T112 is 1V, the voltage of the input of the current source circuit 120 can be limited to about 1V. In some embodiments, the power control circuit 110 also can be referred to "a voltage limit circuit" or "a voltage limiter." Further, the power control circuit 110 can be configured to limit the current I11 provided to the input of the current source circuit 120 to less than about 0.1 μA (such as less than about 0.095 μA, less than about 0.090 μA, less than about 0.085 μA, or less).

The current source circuit 120 includes transistors T121, T122, T123 and T124. A gate of the transistor T121 is connected to the source of the transistor T112, a source of the transistor T121 is connected to a collector of a transistor T141 (described below), a drain of the transistor T121 is connected to a source of the transistor T122. A gate of the transistor T122 is connected to the collector of the transistor T141 and a drain of the transistor T122 is connected to a source of the transistor T123. A gate of the transistor T123 is connected to the collector of the transistor T141 and to a gate of the transistor T133 and a drain of the transistor T123 is connected to a source of the transistor T124. A gate of the transistor T124 is connected to the source of the transistor T123 and a drain of the transistor T124 is connected to a power source V13 (or a power supply). In some embodiments, the transistors T121, T122, T123 and T124 are D-mode pHEMT.

The transistors T121, T122, T123 and T124 are configured to determine or set a current I12 of the current source circuit 120. In some embodiments, the transistors T121 and T122 can be replaced by a large resistor to precisely control or reduce the current I12. However, such a large resistor may occupy a large area of the chip/die, which can hinder the miniaturization of the chip/die. By using the transistors T121 and T122 to replace the large resistor, a total area of the chip/die can be reduced. In addition, adjusting the size of the transistors T121 and T122 can adjust the equivalent resistance of thereof, which can increase design flexibility. In some embodiments, the input voltage V11 is provided to the gate of the transistor T121 through the transistors T11 and T112, to control the transistor T121 as a voltage control resistor (or variable resistor), so that the current source circuit 120 can act as a voltage control current source.

The enable circuit 130 includes transistors T131 and T132. A drain of the transistor T131 is connected to an enable input voltage V12, which can activate the power amplifier 100. A gate of the transistor T131 is connected to a base of the transistor T141 and a source of the transistor T131 is connected to a gate of the transistor T132. A source of the transistor T132 is connected to a base of the transistor T145 and a drain of the transistor T132 is connected to a source of the transistor T133. In some embodiments, the transistor T131 is a D-mode pHEMT, and can act as a voltage limiter to limit the voltage of the gate of the transistor T132 at a predetermined voltage.

The current mirror circuit 140 includes transistors T141, T142, T143, T144, T145 and T146. A collector of the transistor T141 is connected to the current source circuit 120 (e.g., to the source of the transistor T121), a base of the transistor T141 is connected to the enable circuit 130 (e.g., to the gate of the transistor T131) and an emitter of the transistor T141 is connected to a ground. A source and a gate of the transistor T142 are connected to the base of the transistor T141 and a drain of the transistor T142 is connected to a source of the transistor T143. A gate of the transistor T143 is connected to the gate and the source of the transistor T142 and a drain of the transistor T143 is connected to a source of the transistor T144. A drain of the transistor T144 is connected to an emitter of the transistor T145. The gates of the transistors T142, T143 and T144 are connected to a gate of the transistor T146. A base of the transistor T145 is connected to the enable circuit 130 (e.g., to the source of the transistor T132) and a collector of the transistor T145 is connected to the power source V13. A drain of the transistor T146 is connected to the drain of the transistor T144 and the emitter of the transistor T145 and a source of the transistor T146 are connected to the output circuit 150 (e.g., a base of the transistor T151).

The current mirror circuit 140 is connected to the current source circuit 120 and the enable circuit 130 to generate a current I13 based on the current I12 of the current source circuit 120. In some embodiments, a value of the current I13 is approximately equal to a predetermined ratio of a value of the current I12. In some embodiments, the transistors T142, T143 and T144 and the transistor T146 may function as two ballast resistors to limit the amount of the current I13 and to compensate for a variation of a temperature of the power amplifier 100. In some embodiments, the transistors T142, T143 and T144 can be replaced by a large resistor and the transistor T146 can be replaced by another large resistor. However, such large resistors may occupy a large area of the chip/die, which can hinder the miniaturization of the chip/die. By using the transistors T142, T143, T144 and T146 to replace the large resistors, a total area of the chip/die can be reduced. In addition, adjusting the size of the transistors T142, T143, T144 and T146 can adjust the equivalent resistance of thereof, which can increase the design flexibility.

The output circuit 150 includes a transistor T151. A base of the transistor T151 is connected to the current mirror circuit 140 (e.g., to the source of the transistor T146) and configured to receive the current I13 from the current mirror circuit 140 to set a direct current (DC) bias of the output circuit 150. An emitter of the transistor T151 is connected to a ground and the collector of the transistor T151 is connected to the capacitor C12 and a power source V14 (or a power supply) through the inductor L11. The base of the transistor T151 is further configured to receive a high frequency signal (e.g., radio frequency signal) from an input Vin and output an amplified signal at an output (e.g., a collector of the transistor T151) of the power circuit 150. In some embodiments, the (optional) capacitor C11 is connected between the base of the transistor T151 and the input Vin to block the DC current (e.g., I13). In some embodiments, the output circuit 150 may include multiple transistors (e.g., multiple transistors connected in a parallel arrangement) to increase the power and heat dissipation of the power amplifier 100.

Figure 1B:
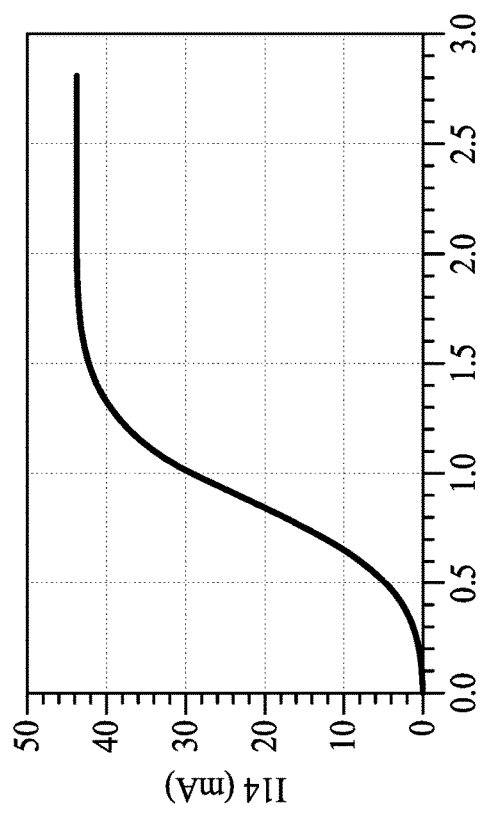
FIG. 1B and FIG. 1C illustrate simulation results of the power amplifier shown in FIG. 1A in accordance with some embodiments of the present disclosure.

FIG. 1B illustrates a simulation result of the power amplifier 100 shown in FIG. 1A in accordance with some embodiments of the present disclosure. In FIG. 1B, the x-axis represents the voltage (V) of the input voltage V11 and the y-axis represents the current I14 of output circuit 150. As shown in FIG. 1B, when the voltage of the input voltage V11 increases from about 0V to about 1.8V, or to about 2.0V, the current I14 of the output circuit 150 increases from 0 milliamps (mA) to about 45 mA. Since the current I14 of the output circuit 150 can be adjusted based on the voltage of the input voltage V11, the power amplifier 100 can include multiple power levels to meet the specifications for a multi-band communication device.

Figure 1C:
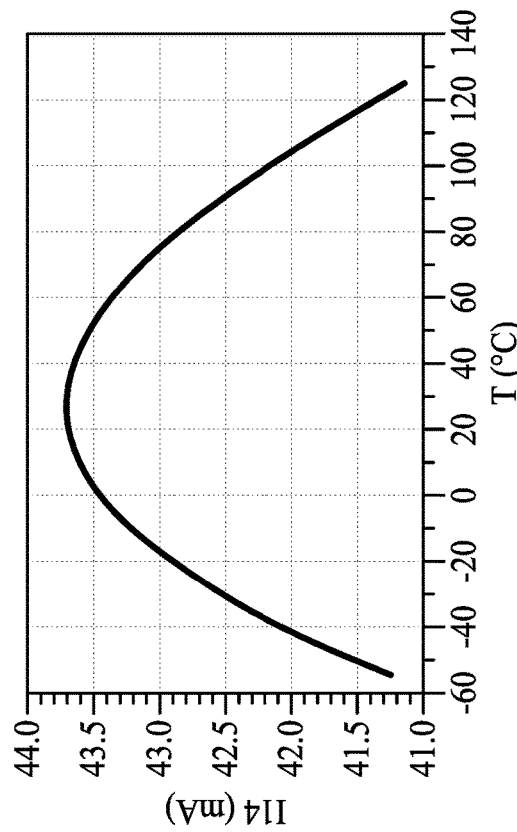

FIG. 1C illustrates a simulation result of the power amplifier 100 shown in FIG. 1A in accordance with some embodiments of the present disclosure. In FIG. 1C, the x-axis represents the temperature in degrees Celsius (° C.) of the power amplifier 100 and the y-axis represents the current I14 of output circuit 150. As shown in FIG. 1C, in the case that the temperature of the power amplifier 100 increases from about −55° C. to about 125° C., the current I14 of the output circuit 150 has a deviation of less than about 3 mA (e.g. less than about 2.9 mA, or less than about 2.8 mA, or less than about 2.7 mA).

Figure 2A:
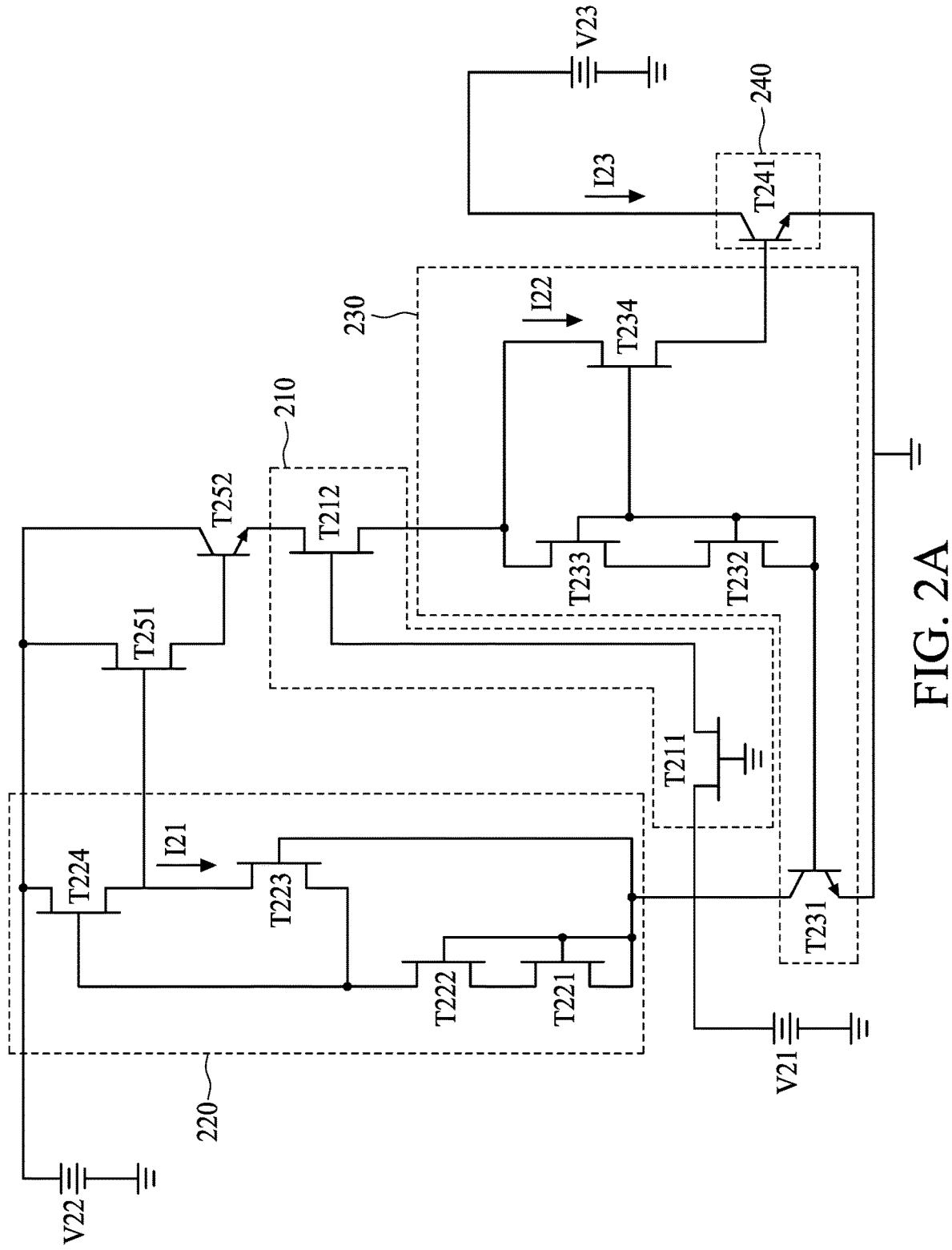
FIG. 2A is a schematic diagram illustrating a power amplifier in accordance with some embodiments of the present disclosure.

FIG. 2A is a schematic diagram illustrating a power amplifier 200 in accordance with some embodiments of the present disclosure. The power amplifier 200 includes a power control circuit 210, a current source circuit 220, a current mirror circuit 230 and an output circuit 240. The power amplifier 200 further includes a transistor T251 and a transistor T252.

The power control circuit 210 includes transistors T211 and T212. A drain of the transistor T211 is connected to an input voltage V21, a gate of the transistor T211 is connected to a ground and a source of the transistor T211 is connected to a gate of the transistor T212. A source of the transistor T212 is connected to the current source circuit 230 (e.g., to a drain of the transistor T233 and a drain of the transistor T234) and a drain of the transistor T212 is connected to an emitter of the transistor T252. In some embodiments, the transistors T211 is a D-mode pHEMT, and thus it can act as a voltage limiter to limit the voltage of the gate of the transistor T212 to a predetermined voltage. In some embodiments, the transistor T212 can act as a variable resistor when operating in a linear region (or an ohm region).

The current source circuit 220 includes transistors T221, T222, T223 and T224. Gates of the transistors T221, T222 and T223 are connected to the current mirror circuit 230 (e.g., to a collector of the transistor T231). A source of the transistor T221 is connected to the collector of the transistor T231 and a drain of the transistor T221 is connected to a source of the transistor T222. A drain of the transistor T222 is connected to a source of the transistor T223 and a gate of the transistor T224. A drain of the transistor T223 is connected to a source of the transistor T224 and a gate of the transistor T251. A drain of the transistor T224 is connected to a power source V22 (or a power supply). In some embodiments, the transistors T221, T222, T223 and T224 are D-mode pHEMT.

The transistors T221, T222, T223 and T224 are configured to determine or set a current I21 of the current source circuit 220. In some embodiments, the transistors T221 and T222 can be replaced by a large resistor to precisely control or reduce the current I21. However, such a large resistor may occupy a large area of the chip/die, which can hinder the miniaturization of the chip/die. By using the transistors T221 and T222 to replace the large resistor, the total area of the chip/die can be reduced. In addition, adjusting the size of the transistors T221 and T222 can adjust the equivalent resistance of thereof, which can increase the design flexibility.

The current mirror circuit 230 includes transistors T231, T232, T233 and T234. The collector of the transistor T231 is connected to the current source circuit 220, a base of the transistor T231 is connected to a source and a gate of the transistor T232, a gate of the transistor T233 and a gate of the transistor T234, and an emitter of the transistor T231 is connected to a ground. A drain of the transistor T232 is connected to a source of the transistor T233. A drain of the transistor T233 is connected to the power control circuit 210 (e.g., to the source of the transistor T212) and a drain of the transistor T234. A source of the transistor T234 is connected to the output circuit 240 (e.g., to a base of the transistor T241).

The current mirror circuit 230 is connected to the current source circuit 220 and the power control circuit 210 and to generate a current I22 based on the current I21 of the current source circuit 220. In some embodiments, a value of the current I22 is approximately equal to a predetermined ratio of a value of the current I21. In some embodiments, the transistors T232 and T233 and the transistor T234 may function as two ballast resistors to limit the amount of the current I22 and to compensate for the variation of the temperature of the power amplifier 200. In some embodiments, the transistors T232 and T233 can be replaced by a large resistor and the transistor T234 can be replaced by another large resistor. However, such large resistors can occupy a large area of the chip/die, which can hinder the miniaturization of the chip/die. By using the transistors T232, T233 and T234 to replace the large resistors, the total area of the chip/die can be reduced. In addition, adjusting the size of the transistors T232, T233 and T234 can adjust the equivalent resistance of thereof, which can increase the design flexibility.

The output circuit 240 includes a transistor T241. A base of the transistor T241 is connected to the current mirror circuit 230 (e.g., to the source of the transistor T234) and configured to receive the current I22 from the current mirror circuit 230 to set a DC bias of the output circuit 240. An emitter of the transistor T241 is connected to a ground and the collector of the transistor T241 is connected to a power source V23 (or a power supply). In some embodiments, the base of the transistor T241 is further configured to receive a high frequency signal (e.g., a radio frequency signal) and to output an amplified signal at an output (e.g., a collector of the transistor T241) of the power circuit 240. In some embodiments, the output circuit 240 may include multiple transistors (e.g., multiple transistors connected in a parallel arrangement) to increase the power and the heat dissipation of the power amplifier 200.

Figure 2B:
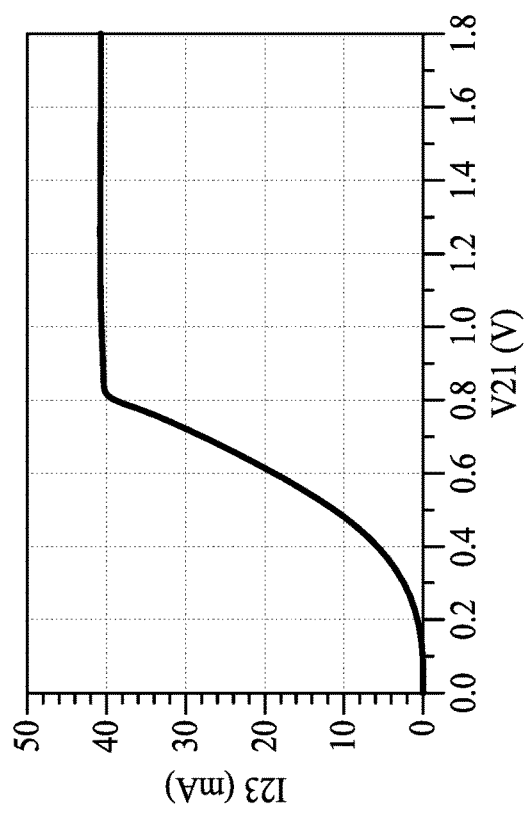
FIG. 2B and FIG. 2C illustrate simulation results of the power amplifier shown in FIG. 2A in accordance with some embodiments of the present disclosure.

FIG. 2B illustrates a simulation result of the power amplifier 200 shown in FIG. 2A in accordance with some embodiments of the present disclosure. In FIG. 2B, the x-axis represents the voltage (V) of the input voltage V21 and the y-axis represents the current I23 of output circuit 240. As shown in FIG. 2B, when the voltage of the input voltage V21 increases from 0V to about 0.8V, the current I23 of the output circuit 240 increases from 0 mA to about 41 mA. Since the current I23 of the output circuit 240 can be adjusted based on the voltage of input voltage V21, the power amplifier 200 can include multiple power levels to meet the specifications for a multi-band communication device.

Figure 2C:
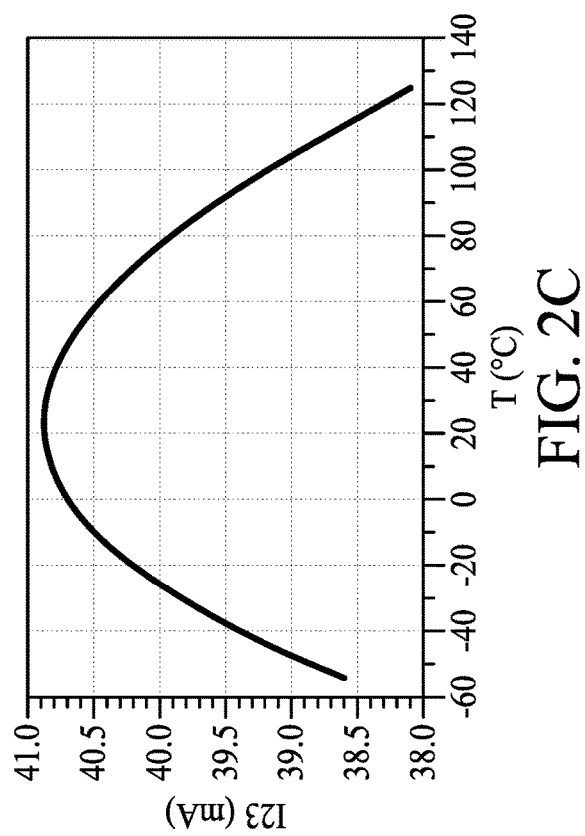

FIG. 2C illustrates a simulation result of the power amplifier 200 shown in FIG. 2A in accordance with some embodiments of the present disclosure. In FIG. 2C, the x-axis represents the temperature (° C.) of the power amplifier 200 and the y-axis represents the current I23 of output circuit 240. As shown in FIG. 2C, in the case that the temperature of the power amplifier 200 increases from about −55° C. to about 125° C., the current I23 of the output circuit 240 has a deviation of less than about 3 mA (e.g. less than about 2.9 mA, less than about 2.8 mA, or less than about 2.7 mA).

Figure 3:
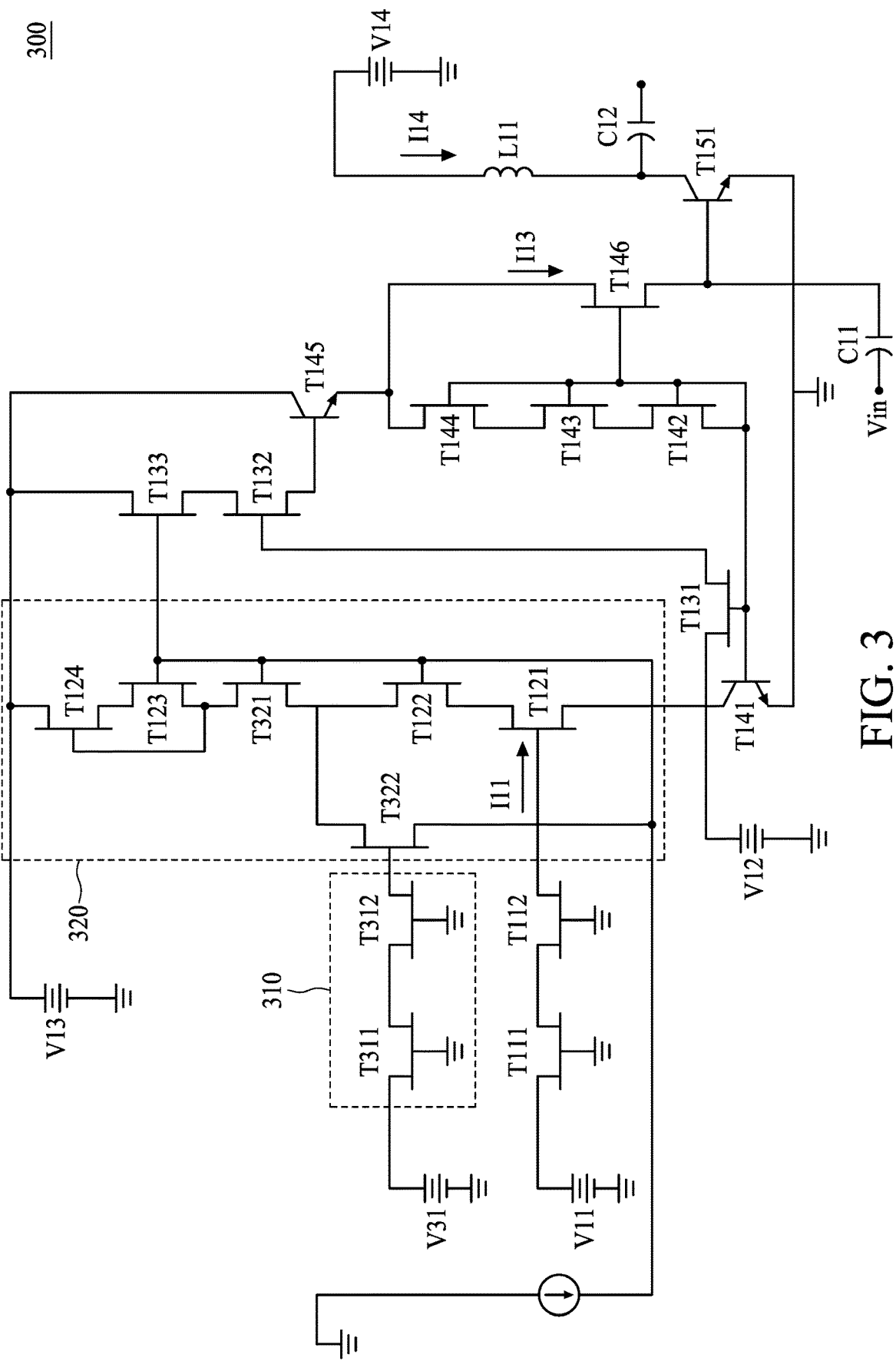
FIG. 3 is a schematic diagram illustrating a power amplifier in accordance with some embodiments of the present disclosure.

FIG. 3 is a schematic diagram illustrating a power amplifier 300 in accordance with some embodiments of the present disclosure. The power amplifier 300 is similar to the power amplifier 100 shown in FIG. 1A, and the differences therebetween include that the power amplifier 300 further includes a power control circuit 310 in addition to the power control circuit 110 and that the current source circuit 320 further includes transistors T321 and T322 compared with the current source circuit 120 in FIG. 1A.

The power control circuit 310 includes transistors T311 and T312. A drain of the transistor T311 is connected to an input voltage V31, a gate of the transistor T311 is connected to a ground and a source of the transistor T311 is connected to a drain of the transistor T312. A gate of the transistor T312 is connected to a ground and a source of the transistor T312 is connected to the current source circuit 320 (e.g., to a gate of the transistor T322). In some embodiments, the number of the transistors of the power control circuit 310 can be adjusted depending on design specifications. For example, the power control circuit 310 may include one transistor or more than two transistors connected in series. In some embodiments, the power control circuit 310 is identical to the power control circuit 110. Alternatively, the power control circuit 310 can be different than the power control circuit 110. In some embodiments, the transistors T311 and T312 are D-mode pHEMT, and thus the transistors T311 and T312 can limit the voltage of the gate of the transistor T322 at a predetermined voltage. For example, the power control circuit 310 can be referred to "a voltage limit circuit" or "a voltage limiter."

A gate of the transistor T321 is connected to gates of the transistors T133, T122 and T123, a source of the transistor T321 is connected to drains of the transistors T322 and T122 and a drain of the transistor T321 is connected to the source of the transistor T123. The source of the transistor T322 is connected to the source of the transistor T121.

In some embodiments, the two sets of power control circuits 110 and 310 may achieve 2-bit power level control. For example, in the case that voltages of both of the input voltages V11 and V31 are high, the current source 320 is operated at a high power mode. In the case that the voltage of the input voltage V31 is high and the voltage of the input voltage V11 is low, the current source 320 is operated at a middle power mode (assuming that a size of the transistor T322 is greater than a size of the transistor T121). In the case that the voltage of the input voltage V31 is low and the voltage of the input voltage V11 is high, the current source 320 is operated at a low power mode (assuming that a size of the transistor T322 is greater than a size of the transistor T121). In the case that voltages of both of the input voltages V11 and V31 are low, the current source 320 is turned off. In accordance the embodiments shown in FIG. 3, by adding the power control circuit 310, multiple power level modes can be achieved, which would meet the specifications for a multi-band communication device. In some embodiments, the power amplifier may include more than two sets of power control circuits to achieve more control modes.

Figure 4:
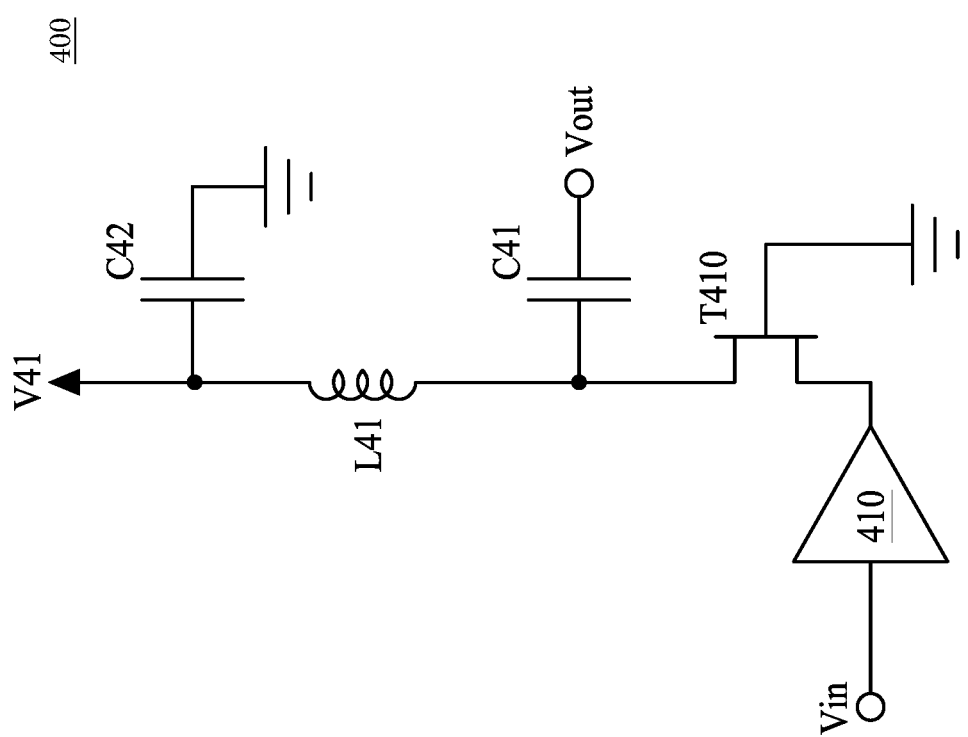
FIG. 4 is a block diagram of a multi-chip module (MCM) in accordance with some embodiments of the present disclosure.

FIG. 4 is a block diagram of a multi-chip module (MCM) 400 in accordance with some embodiments of the present disclosure. The MCM 400 includes a power amplifier 410 and a gallium nitride (GaN) transistor T410 in cascade connection with the power amplifier 410. In some embodiments, the MCM 400 is a wireless communication system or a portion of the wireless communication system.

In some embodiments, the power amplifier 410 can be any of the power amplifiers 100, 200 and 300 in FIGS. 1A, 2A and 3 or any other GaAs or SiGe power amplifiers. A gate of the GaN transistor T410 is connected to a ground and a source of the GaN transistor T410 is connected to the output of the power amplifier 410. A drain of the GaN transistor T410 is connected to a power source V41 (or a power supply) through an inductor L41, and to an output Vout through a capacitor C41. A capacitor C42 is connected between the power source V41 and a ground. In some embodiments, the GaN transistor is a HEMT.

The power amplifier is configured to provide a DC bias for the GaN transistor T410 and thus an additional bias circuit (such as a power supply, a power control circuit and the like) can be omitted. The power amplifier 410 also provides a drive stage for the GaN transistor T410, and thus an additional drive stage can be omitted. In addition, a negative voltage generator for biasing the GaN transistor T410 can be omitted. Further, since the power amplifier 410 includes the temperature compensation circuit, an additional temperature compensation circuit can be omitted for the GaN transistor T410. Therefore, in accordance with the embodiments of FIG. 4, by cascading the GaN transistor T410 with the power amplifier 410, the process for designing the MCM module 400 can be simplified and the manufacturing cost can be reduced.

As used herein, the singular terms "a," "an," and "the" may include a plurality of referents unless the context clearly dictates otherwise.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "approximately" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A power amplifier circuit comprising:
a current source circuit comprising a first transistor and a second transistor, a source of the first transistor connected to a drain of the second transistor and a gate of the first transistor connected to a source of the second transistor;
a power control circuit connected to a gate of the second transistor;
a current mirror circuit connected to the gate of the first transistor and the source of the second transistor; and
an output circuit connected to the current mirror circuit, wherein the power control circuit is configured to receive a first voltage input and to control a current of the output circuit based on the first voltage input.

2. The power amplifier circuit of claim 1, wherein the power control circuit comprises a third transistor, and the third transistor comprises a drain connected to the first voltage input, a gate connected to ground and a source connected to the gate of the second transistor.

3. The power amplifier circuit of claim 2, wherein the power control circuit further comprises a fourth transistor between the third transistor and the first voltage input, and the fourth transistor comprises a drain connected to the first voltage input, a gate connected to ground and a source connected to the drain of the third transistor.

4. The power amplifier circuit of claim 1, wherein the current source circuit further comprises a third transistor and a fourth transistor, and the third transistor comprises a source connected to a drain of the first transistor, a gate connected to the source of the first transistor and a drain connected to the first voltage input.

5. The power amplifier circuit of claim 1, further comprising an enable circuit, wherein
the enable circuit comprises a third transistor and a fourth transistor;
a drain of the third transistor is connected to the first voltage input, a gate of the third transistor is connected to the current mirror circuit, and a source of the third transistor is connected to a gate of the fourth transistor; and
a source of the fourth transistor is connected to the current mirror circuit and a drain of the fourth transistor is connected to the gate of the first transistor.

6. The power amplifier circuit of claim 5, further comprising a fifth transistor, wherein the fifth transistor comprises a drain connected to a second voltage input, a gate connected to the gate of the first transistor and a source connected to the drain of the fourth transistor.

7. The power amplifier circuit of claim 5, wherein
the current mirror circuit further comprises a fifth transistor and a sixth transistor;
a collector of the fifth transistor is connected to the source of the second transistor, a base of the fifth transistor is connected to an emitter of the sixth transistor, and an emitter of the fifth transistor is connected to the output circuit; and
the emitter of the sixth transistor is connected to the output circuit, a base of the sixth transistor is connected to the source of the fourth transistor and a collector of the sixth transistor is connected to a second voltage input.

8. The power amplifier circuit of claim 7, wherein
the current mirror circuit further comprises a seventh transistor, an eighth transistor, a ninth transistor and a tenth transistor;
a drain of the seventh transistor is connected to the emitter of the sixth transistor, a gate of the seventh transistor is connected to the base of the fifth transistor and a source of the seventh transistor is connected to a drain of the eighth transistor;
a gate of the eighth transistor is connected to the base of the fifth transistor and a source of the eighth transistor is connected to a drain of the ninth transistor;
a gate and a source of the ninth transistor are connected to the base of the fifth transistor; and
a gate of the tenth transistor is connected to the base of the fifth transistor, a drain of the tenth transistor is connected to the emitter of the sixth transistor and a source of the tenth transistor is connected to the output circuit.

9. A power amplifier circuit comprising:
a current source circuit;
a power control circuit comprising a first transistor and a second transistor, the first transistor comprising a drain connected to a first voltage input, a gate connected to ground and a source connected to a gate of the second transistor;
a current mirror circuit comprising a first node connected to the current source circuit and a second node connected to a source of the second transistor; and
an output circuit connected to the current mirror circuit.

10. The power amplifier circuit of claim 9, wherein the output circuit is configured to adjust an output current based on the first voltage input.

11. The power amplifier circuit of claim 9, wherein
the current source circuit comprises a third transistor, a fourth transistor, a fifth transistor and a sixth transistor;
a drain of the third transistor is connected to a second voltage input, a gate of the third transistor is connected to a source of the fourth transistor and a source of the third transistor is connected to a drain of the fourth transistor;
a gate of the fourth transistor is connected to the first node of the current mirror circuit;
a drain of the fifth transistor is connected to the source of the fourth transistor, a gate of the fifth transistor is connected to the gate of the fourth transistor and a source of the fifth transistor is connected to a drain of the sixth transistor; and
a gate and a source of the sixth transistor are connected to the gate of the fourth transistor.

12. The power amplifier circuit of claim 11, further comprising a seventh transistor and a eighth transistor, wherein
a gate of the seventh transistor is connected to the source of the third transistor, a drain of the seventh transistor is connected to the second voltage input and a source of the seventh transistor is connected to a base of the eighth transistor; and
a collector of the eighth transistor is connected to the second voltage input and an emitter of the eight transistor is connected to a drain of the second transistor.

13. The power amplifier circuit of claim 9, wherein
the current mirror circuit comprises a third transistor, a fourth transistor, a fifth transistor and a sixth transistor;
a collector of the third transistor is connected to the current source circuit, a base of the third transistor is connected to a gate of the sixth transistor and an emitter of the third transistor is connected to the output circuit;
a source of the fourth transistor is connected to the output circuit, a gate of the fourth transistor is connected to the gate of the sixth transistor and a drain of the fourth transistor is connected to the source of the second transistor; and
a drain of the fifth transistor is connected to the source of the second transistor, a gate of the fifth transistor is connected to the gate of the sixth transistor and a source of the fifth transistor is connected to a drain of the sixth transistor.

14. A power amplifier circuit comprising:
a current source circuit configured to generate a first current;
a current mirror circuit connected to the current source circuit and configured to generate a second current in response to the first current;
a power control circuit connected to the current source circuit and the current mirror circuit and configured to receive a first voltage; and
an output circuit connected to the current mirror circuit and configured to generate a third current, wherein the third current varies in response to the first voltage.

15. The power amplifier circuit of claim 14, wherein the third current increases from 0 mA to 45 mA when the first voltage increases from 0 V to 2 V.

16. The power amplifier circuit of claim 14, wherein the third current increases from 0 mA to 41 mA when the first voltage increases from 0 V to 0.8 V.

17. The power amplifier circuit of claim 14, wherein
the current source circuit comprises a first transistor and a second transistor;
a source of the first transistor is connected to a drain of the second transistor, a gate of the first transistor is connected to a source of the second transistor; and
a gate of the second transistor is connected to receive the first voltage.

18. The power amplifier circuit of claim 17, wherein the power control circuit comprises a third transistor, and the third transistor comprises a drain connected to receive the first voltage, a gate connected to ground and a source connected to the gate of the second transistor.

19. The power amplifier circuit of claim 17, wherein
the power control circuit comprises a third transistor and a fourth transistor;
a drain of the third transistor is connected to a source of the fourth transistor, a gate of the third transistor is connected to ground and a source of the third transistor is connected to the gate of the second transistor; and
a drain of the fourth transistor is connected to receive the first voltage and a gate of the fourth transistor is connected to ground.

20. The power amplifier circuit of claim 17, wherein a resistance value of the second transistor varies in response to the first voltage.

* * * * *